(12) United States Patent
Chung et al.

(10) Patent No.: US 11,967,351 B2
(45) Date of Patent: Apr. 23, 2024

(54) PHYSICALLY UNCLONABLE FUNCTION CELL AND OPERATION METHOD OF SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Chia-Che Chung, Hsinchu (TW); Chia-Jung Tsen, Taoyuan (TW); Ya-Jui Tsou, Taichung (TW); Chee-Wee Liu, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 182 days.

(21) Appl. No.: 17/719,155

(22) Filed: Apr. 12, 2022

(65) Prior Publication Data

US 2023/0013730 A1    Jan. 19, 2023

Related U.S. Application Data

(60) Provisional application No. 63/222,796, filed on Jul. 16, 2021.

(51) Int. Cl.
*G11C 11/16* (2006.01)
*H03K 19/1776* (2020.01)

(52) U.S. Cl.
CPC ........ *G11C 11/1673* (2013.01); *G11C 11/161* (2013.01); *G11C 11/1657* (2013.01); *H03K 19/1776* (2013.01)

(58) Field of Classification Search
CPC .............. G11C 11/1673; G11C 11/161; G11C 11/1657; G11C 7/24; G11C 11/1659;
(Continued)

(56) References Cited

U.S. PATENT DOCUMENTS

| 2019/0253266 A1 | 8/2019 | Lee et al. |
| 2020/0084052 A1* | 3/2020 | O'Connell ............... G11C 7/24 |
| 2021/0184870 A1* | 6/2021 | Hurwitz ................ H04L 9/3278 |

FOREIGN PATENT DOCUMENTS

| CN | 109495272 A | 3/2019 |
| TW | 201918928 A | 5/2019 |
| TW | 201939342 A | 10/2019 |

OTHER PUBLICATIONS

Kumar, A. et al., "Switching-time dependent PUF using STT-MRAM", 2018 31st International Conference on VLSI Design and 2018 17th International Conference on Embedded Systems (VLSID), pp. 434-438, 2017 IEEE. Jan. 6, 2018.

(Continued)

*Primary Examiner* — Xiaochun L Chen
(74) *Attorney, Agent, or Firm* — Maschoff Brennan

(57) ABSTRACT

A device is provided. The device includes a physical unclonable function (PUF) cell array. The PUF cell array includes multiple bit cells, and generates a PUF response output, in response to a challenge input, based on a data state of one bit cell in the bit cells. Each of the bit cells stores a bit data and includes a transistor having a control terminal coupled to a word line and a first terminal coupled to a source line, a first memory cell having a first terminal coupled to a first data line and a second terminal coupled to a second terminal of the transistor, and a second memory cell having a first terminal coupled to a second data line, different from the first data line, and a second terminal coupled to the second terminal of the first memory cell at the second terminal of the transistor.

20 Claims, 10 Drawing Sheets

(58) Field of Classification Search
CPC ............ G11C 11/1675; G11C 11/1695; H03K 19/1776; G06F 21/73
See application file for complete search history.

(56) References Cited

OTHER PUBLICATIONS

Xiao, Y. et al., "Novel concept of the transistor variation directed toward the circuit implementation of physical unclonable function (PUF) and true-random-number generator (TRNG)", International Electron Devices Meeting (IEDM), pp. 506-509, 2019 IEEE. Dec. 7, 2019.

Jeloka, S. et al., "A sequence dependent challenge-response PUF using 28nm SRAM 6T bit cell", 2017 Symposium on VLSI Circuits Digest of Technical Papers, pp. 270-271, 2017 JSAP. Jun. 5, 2017.

* cited by examiner ized circuit manufacturing system, and an integrated circuit manufac-
PHYSICALLY UNCLONABLE FUNCTION CELL AND OPERATION METHOD OF SAME

CROSS REFERENCE

The present application claims priority to U.S. Provisional Application No. 63/222,796, filed on Jul. 16, 2021, which is herein incorporated by reference in its entirety.

BACKGROUND

With the increasing use of electronic devices utilizing integrated circuits to provide different types of information for a variety of different applications, there has been an increasing need to adequately protect sensitive and/or critical information that may be stored within an electronic device to limit access to such information to only such other devices that have permission to access the information. As manufacturing variations and/or misalignment tolerances present within the semiconductor fabrication process can cause integrated circuits fabricated by the semiconductor fabrication process to differ from each other, physical unclonable functions (PUFs) use this physical uniqueness to differentiate integrated circuits from each other. The PUFs represent challenge-response mechanisms in which mapping between challenges and their corresponding responses are dependent on the complex and variable nature of the physical material used to fabricate the integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
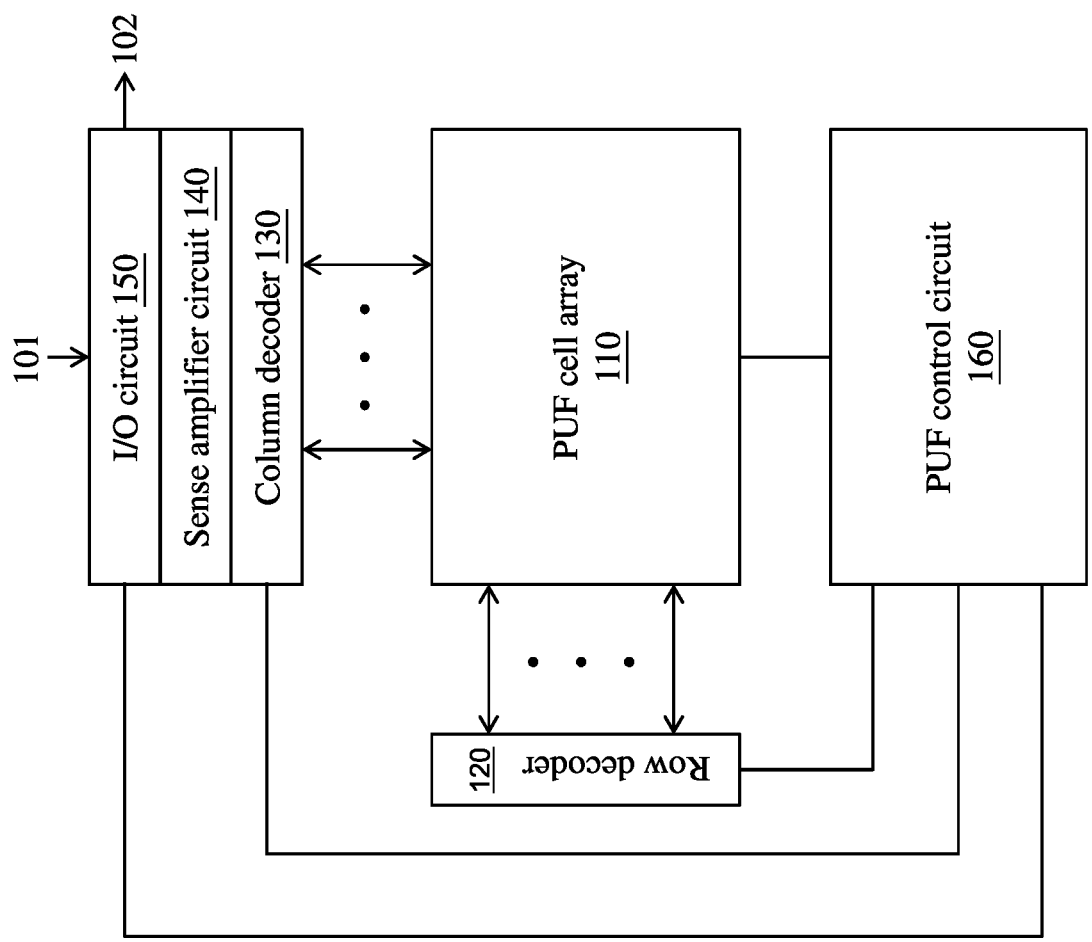
FIG. 1 is a schematic diagram of a physically unclonable function (PUF) generator, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

A physically unclonable function (PUF) generator is a physical structure generally within an integrated circuit that provides a number of corresponding PUF response outputs in response to challenges inputs to the PUF generator. A unique identity of the integrated circuit is established by such challenge-response pairs provided by the PUF generator. In some embodiments, the PUF generator of a type, referred to as weak PUF, generates a PUF response output based on one bit data that is stored in one bit cell in the PUF generator and further associated with all elements in the corresponding one challenge input. Accordingly, such PUF generator provides higher immunity to machine learning attacks, compared with strong PUF generators that generate a PUF response output based on one bit data which is stored in all bit cells in the PUF generator and is associated with merely one element in the challenged input. In some embodiments, a PUF cell array includes bit cells having one transistor and two MTJ memory cells, in which no MTJ flipping in required for generating a PUF response output. By comparing voltage levels of bit lines coupled to two MTJ memory cells with a small read current, a data state of the corresponding bit cell is determined and output as the PUF response.

Reference is now made to FIG. 1. FIG. 1 is a schematic diagram of a physically unclonable function (PUF) generator 100, in accordance with some embodiments. In the illustrated embodiment of FIG. 1, the PUF generator 100 includes a PUF cell array 110, a row decoder 120, and a column decoder 130. The row decoder 120 and column decoder 130 are coupled to multiple bit cells BC (further shown in FIG. 2) in the PUF cell array 110. The PUF generator 100 further includes a sense amplifier circuit 140, an input/output (I/O) circuit 150, and a PUF control circuit 160, in the illustrated embodiment. In some embodiments, all the components are coupled to each other and further to the PUF control circuit 160. In some embodiments, the I/O circuit 150 is directly coupled to the PUF control circuit 160. In some embodiments, the PUF control circuit 160 is implemented as a separate block, which is not embedded in the PUF cell array 110. In some alternative embodiments, the PUF control circuit 160 is embedded in the PUF cell array 110.

The PUF cell array 110 is configured to generate a PUF response output 102, in response to a challenge input 101, based on a data state (e.g., logical states) of one bit cells in the multiple bit cells BC in the PUF cell array 110 when the PUF control circuit 160 receives a request through the I/O circuit 150 (e.g., a challenge input corresponding to a request to access PUF signatures of the PUF cell array 110, etc.). Further, the PUF control circuit 160 is configured to transmit the PUF response output 102 through the I/O circuit 150. In some other embodiments, the PUF control circuit 160 further receives a request through the I/O circuit 150 (e.g., a request to power on the coupled PUF cell array 110.)

In some embodiments, the PUF control circuit 160 is configured to control (e.g., increase or decrease) a voltage level of a supply voltage applied at each of the bit cells BC, control (e.g., increase or decrease) a voltage level applied at each word line coupled to the row decoder 120, as discussed in further detail below. In some embodiments, the PUF control circuit 160 enables the voltage supply to at least one selected column and at least one selected row in response to the challenge input.

The configurations of FIG. 1 are given for illustrative purposes. Various implements are within the contemplated scope of the present disclosure. For example, in some embodiments, the PUF generator 100 further includes a timing control circuit providing provides control and synchronization on pulse signals during read (extraction) and/or write (enrollment) operations.

Figure 2:
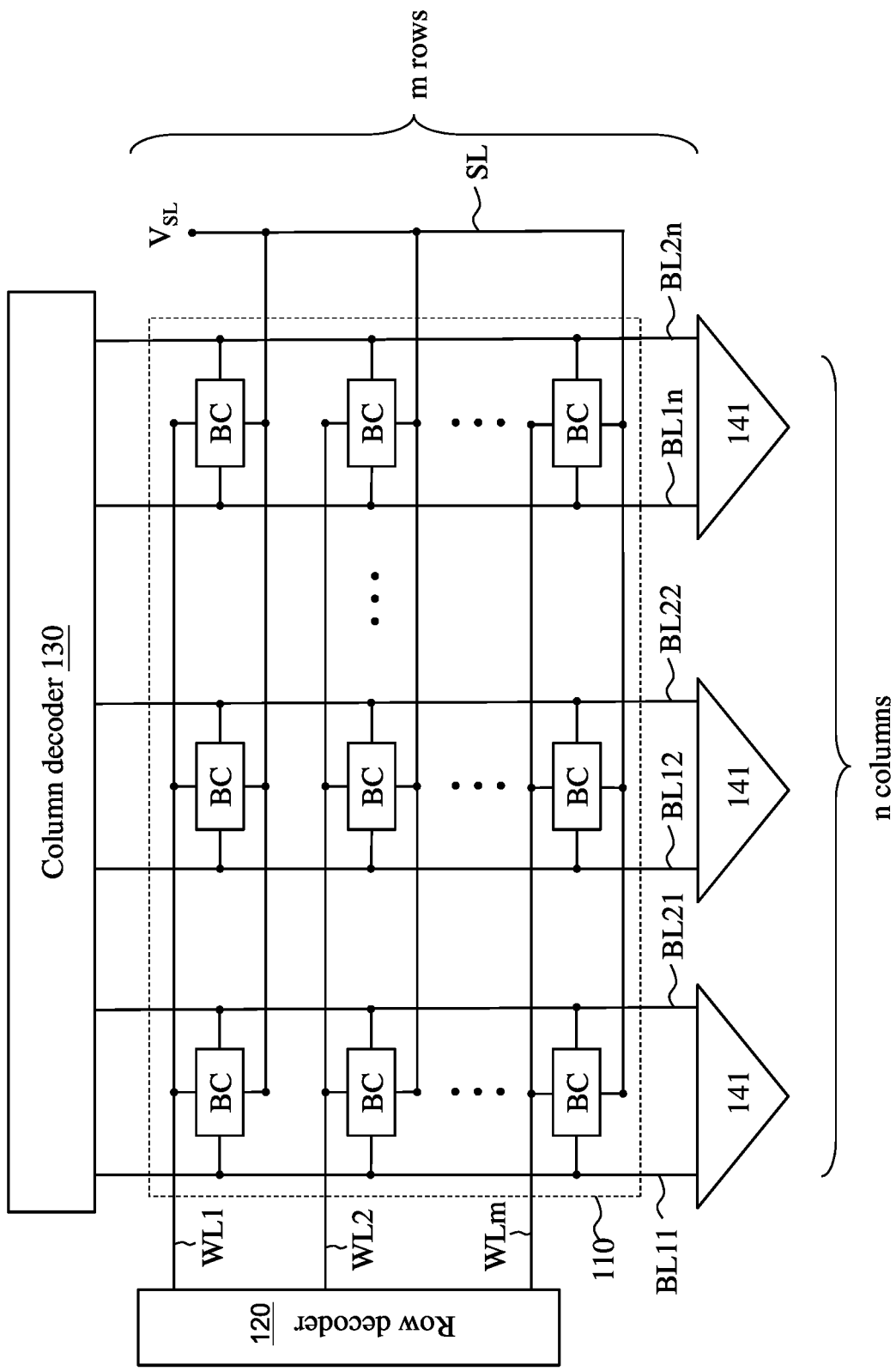
FIG. 2 is a schematic diagram of parts of the PUF generator corresponding to FIG. 1, in accordance with some embodiments.

Reference is now made to FIG. 2. FIG. 2 is a schematic diagram of parts of the PUF generator 100 corresponding to FIG. 1, in accordance with some embodiments. For illustration, the PUF cell array 110 includes the bit cells BC that are arranged in a column-row configuration. Each one of n columns has one of first data lines BL11-BL1$n$ and one of second data lines BL21-BL2$n$, and each one of m rows has one of word line WL1-WLm. More specifically, the first data lines and the second data lines of each column are respectively coupled to the bit cells BC that are disposed in that column, and each of the bit cells in that column is arranged on a different row and coupled to a respective (different) word line. That is, each bit cell BC of the PUF cell array 110 has a terminal coupled to one first data line of a column of the PUF cell array 110, another terminal coupled to one second data line of the column of the PUF cell array 110, and yet another terminal coupled to one word line of a row of the PUF cell array 110. In some embodiments, the first data lines BL11-BL1$n$ and the second data lines BL21-BL2$n$ are arranged in parallel vertically and the word lines WL1-WLm are arranged in parallel horizontally (i.e., perpendicular to the first and second data lines BL11-BL1$n$, BL21-BL2$n$). In some embodiments, the word line for each row of bit cells BC in the PUF cell array 110 are connected together, as shown in FIG. 2.

In addition, as illustratively shown in FIG. 2, each of the bit cells BC further has a terminal coupled to a source line SL on which a voltage $V_{SL}$ is applied. In some embodiments, the voltage $V_{SL}$ various in the enrollment and extraction operations of the PUF cell array 110. In some embodiments, portions of the source line are arranged in parallel horizontally (i.e., perpendicular to the first and second data lines BL11-BL1$n$, BL21-BL2$n$.) and parallel to the word lines WL1-WLm.

The row decoder 120 is configured to receive a row address of the PUF cell array 110 from the PUF control circuit 160 and accordingly apply a word line voltage to activate a corresponding word line. The column decoder 130 is configured to receive a column address of the PUF cell array 110 from the PUF control circuit 160 and apply voltages on corresponding first and second data line. In some embodiments, the row address and the column address correspond to a word address that is associated with the received challenged input of the PUF generator 100. With the cooperation of the row decoder 120 and the column decoder 130, one bit cell BC in the PUF cell array 110 is selected to access.

In some embodiments, each of the bit cells BC has two terminals respectively coupled to two terminals of a sense amplifier that is arranged in the same column. The sense amplifier 141 is included in the sense amplifier circuit 140 of FIG. 1 in each column and configured to compare voltage levels of the first data line and the second data line that are in the same column to generate an output signal as the PUF response output 102. In some embodiments, the output signal indicates a data state of the selected bit cell BC.

The configurations of FIG. 2 are given for illustrative purposes. Various implements are within the contemplated scope of the present disclosure.

Figure 3:
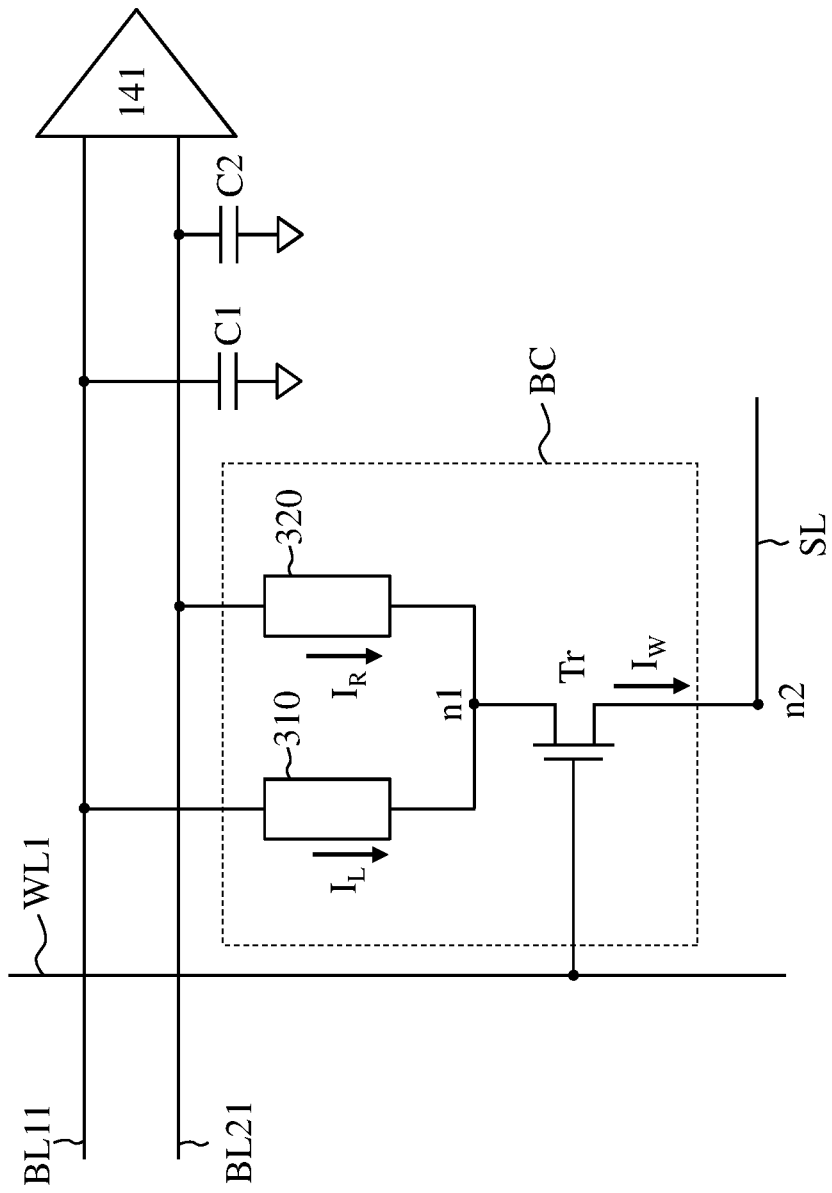
FIG. 3 is a schematic diagram of parts of the PUF generator in an enrollment operation corresponding to FIGS. 1-2, in accordance with some embodiments.

Reference is now made to FIG. 3. FIG. 3 is a schematic diagram of parts of the PUF generator 100 in an enrollment operation corresponding to FIGS. 1-2, in accordance with some embodiments. As shown in the embodiments of FIG. 3, the bit cell BC includes memory cells 310-320 and a transistor Tr. Specifically, taking the bit cell BC coupled to the first data line BL11, the second data line BL21, and the word line WL1 as example, the memory cell 310 includes a terminal coupled to the first data line BL11 and a terminal of the sense amplifier 141, and the memory cell 320 includes a terminal coupled to the second data line BL21 and the other terminal of the sense amplifier 141. The other terminals of the memory cells 310-320 are coupled together at a terminal of the transistor Tr. The other terminal of the transistor Tr is coupled to the source line SL, and a control terminal of the transistor Tr is coupled to the word line WL1. In some embodiments, the PUF generator 100 further includes capacitors C1 and C2 coupled between the memory cells 310-320 and the sense amplifier 141. In some embodiments, the memory cells 310-320 include magnetic tunneling junctions (MTJs) and the transistor Tr is implemented with a N-type metal oxide semiconductor.

Figure 4B:
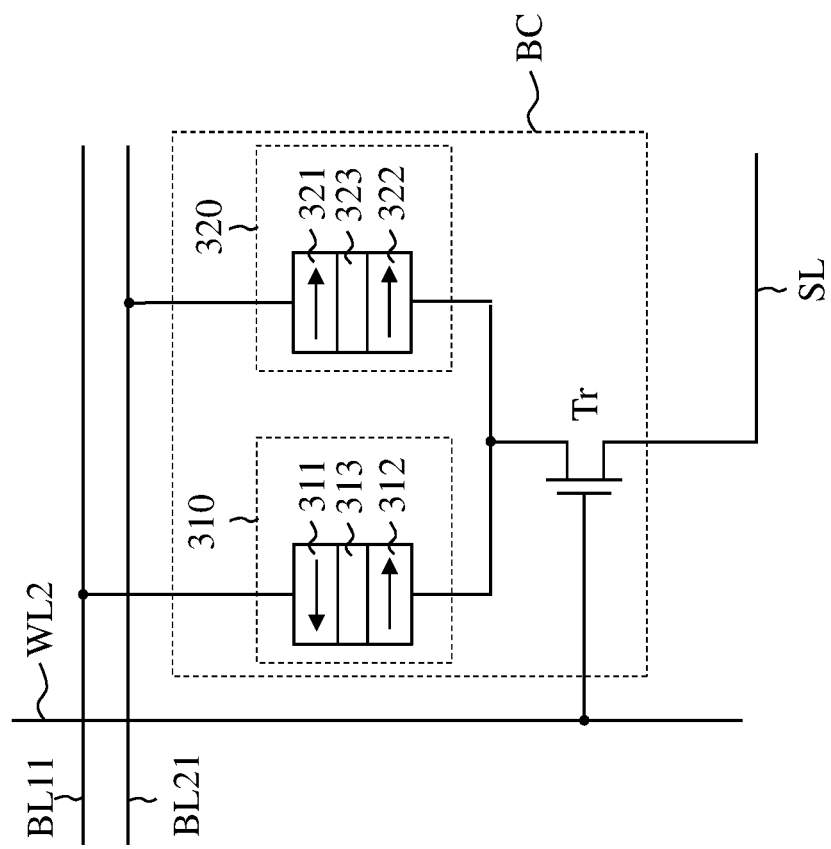
FIGS. 4A-4B are schematic diagrams illustrating the magnetic tunneling junction memory cells in the PUF generator corresponding to FIGS. 1-2, in accordance with some embodiments.
Figure 4A:
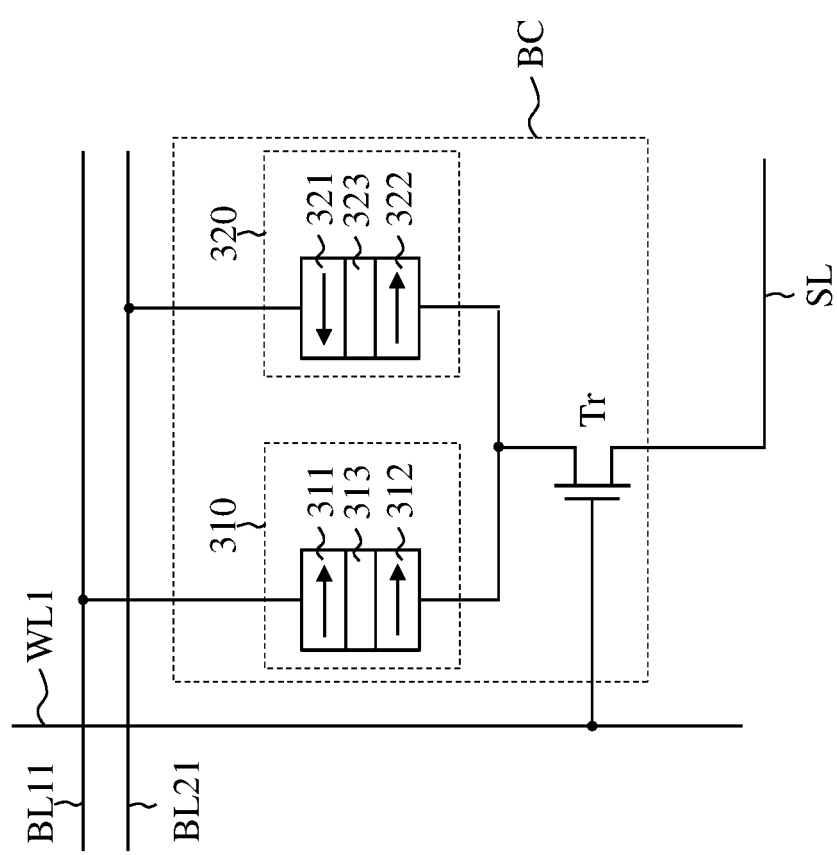

In some embodiments, as shown in FIG. 4A, the memory cells 310-320 are multi-layer structure and include switchable ferromagnetic layers 311 and 321 (also referred to as a free layer) and fixed ferromagnetic layers 312 and 322 (also referred to as a pinned layer) that are separated by thin dielectric layers 313 and 323 (e.g., an thin oxide layer).

In some embodiments, a resistance of the memory cell 310 is substantially different from that of the memory cell 320. For example, when magnet moment (indicated by the arrow) of the switchable ferromagnetic layer, for example, 311 in FIG. 4A, is parallel to the magnet moment of the fixed ferromagnetic layer, for example, 312, the memory cell 310 is configured to have a low resistance state. On the contrary, when magnet moment (indicated by the arrow) of the switchable ferromagnetic layer, for example, 321 in FIG. 4A, is anti-parallel to the magnet moment of the fixed ferromagnetic layer, for example, 322, the memory cell 320 is configured to have a high resistance state. In some embodiments, the low resistance state of the memory cell 310 indicates that a resistance of the memory cell 310 is substantially smaller than that of the memory cell 320 having the high resistance state.

With continued reference to FIG. 3, in some embodiments of the enrollment operation (referred to as a write operation), the bit cell BC is configured to be accessed to store a bit data (e.g., a logic value). For example, magnet moments in the memory cells 310-320 initially are anti-parallel to each other and both the memory cells 310-320 have the high resistance state. In some embodiments, the resistance states of the memory cells 310-320 are provided in magnetic field annealing processes.

In operation, a voltage VDD is applied on control terminal of the transistor Tr through the word line WL1 and on both of the first data line BL11 and the second data line BL21, while the source line SL is grounded. A write current $I_W$ flows from the first data line BL11 and the second data line BL21 to the source line SL, which is a sum current of a current $I_L$ flowing through the memory cell 310 and a current $I_R$ flowing through the memory cell 320. Due to the process variation in manufacturing the memory cells 310-320, tiny resistance difference between the memory cells 310-320 causes one of the currents $I_L$ and $I_R$ be greater than the other, for example, the current $I_L$ being greater than the current $I_R$, such that magnet moment of the switchable ferromagnetic layer in the memory cell 310 flips to be parallel to that of the fixed ferromagnetic layer. Thus, the resistance state of the memory cell 310 is altered to the low resistance state from the high resistance state. Accordingly, the memory cells 310 and 320 have different resistance states when the resistance state of the memory cell 310 is parallel resistance state (i.e., the low resistance state) and the resistance state of the memory cell 320 is anti-parallel resistance state (i.e., the high resistance state.)

Moreover, when the write current $I_W$ increases as the current $I_L$ increments, the voltage $V_{DS}$ crossing two terminals (terminals n1 and n2 shown in FIG. 3) of the transistor Tr correspondingly climbs. For the memory cell 320, the voltage crossing two terminals, that is equal to the voltage VDD minus $V_{DS}$, decreases, and accordingly, keeps the resistance state of the memory cell 320 unchanged, namely, the anti-parallel state.

With reference to FIGS. 3 and 4A together, the bit cell BC including the memory cells 310 having the low resistance state and the memory cell 320 having the high resistance state stores a logic "1 (high logic state)".

In various embodiments, as shown in FIGS. 3 and 4B, when the current $I_R$ is greater than the current $I_L$, the magnet moment of the switchable ferromagnetic layer in the memory cell 320 flips to be parallel to that of the fixed ferromagnetic layer. Thus, the resistance state of the memory cell 320 is altered to the low resistance state from the high resistance state. Accordingly, the resistance state of the memory cell 320 is parallel resistance state (i.e., the low resistance state) and the resistance state of the memory cell 310 is anti-parallel resistance state (i.e., the high resistance state.) In the embodiments mentioned above, the bit cell BC in FIG. 4B including the memory cells 310 having the high resistance state and the memory cell 320 having the low resistance state stores a logic "0 (low logic state)".

Alternatively stated, based on the above, when the bit cells BC in FIGS. 4A-4B have different logic states, the memory cells 310 in the bit cells BC in FIGS. 4A-4B have different resistance states, and memory cells 320 in the bit cells BC in FIGS. 4A-4B have different resistance states.

Furthermore, in some embodiments, as the word line address for selecting a specific bit cell BC in the PUF cell array 110 corresponds to a specific challenge input, the bit data stored in each of the bit cell BC is associated with one specific challenge input. Accordingly, with reference to both FIGS. 4A and 4B, the bit cell BC in the FIG. 4A and the bit cell BC in the FIG. 4B, that are arranged in the same column to be coupled to same first data line BL11 and same second data line BL22 as shown in FIG. 3, store bit data associated with different challenge input, as they are coupled to the word lines WL1 and WL2 respectively.

Figure 5:
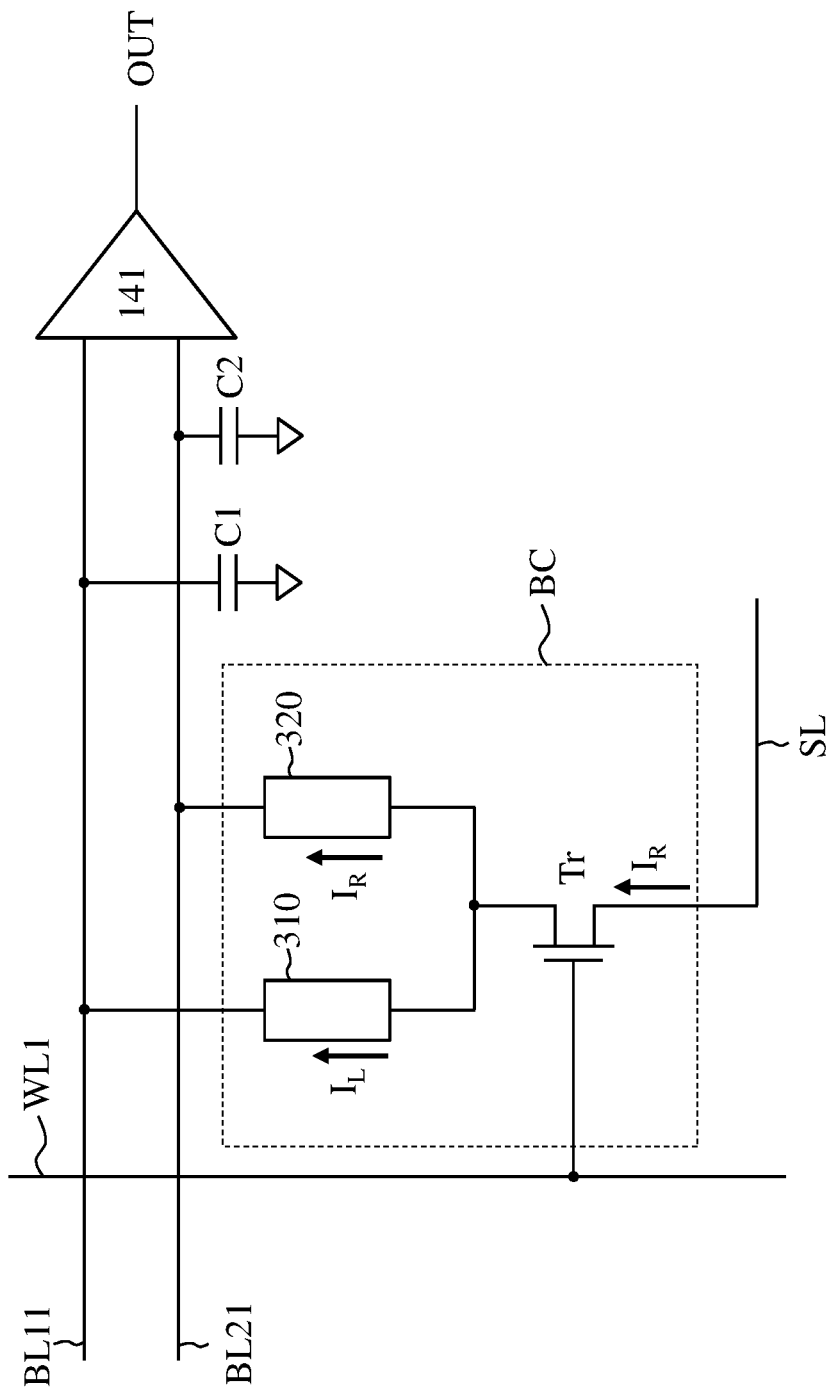
FIG. 5 is a schematic diagram of parts of the PUF generator in an extraction operation corresponding to FIGS. 1-2, in accordance with some embodiments.
Figure 6:
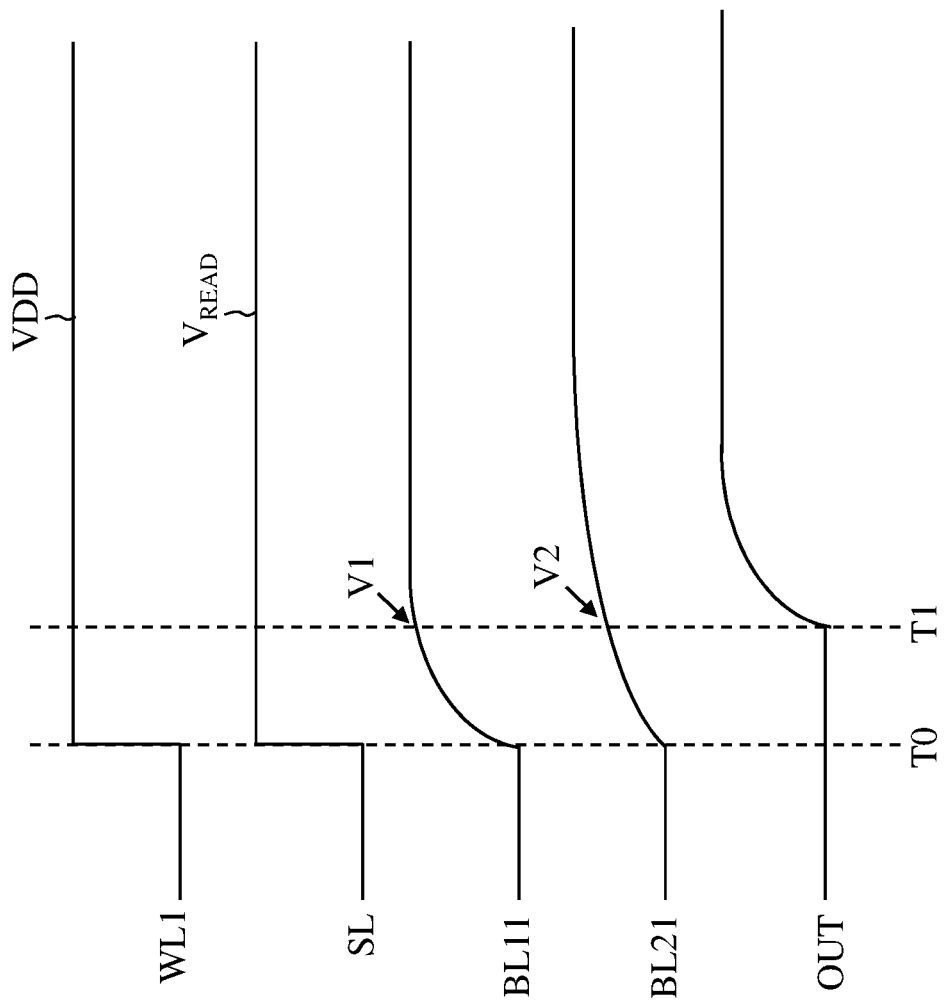
FIG. 6 is a schematic diagram illustrating waveforms of signals in the PUF generator corresponding to FIG. 5, in accordance with some embodiments.

Reference is now made to FIGS. 5-6 together. FIG. 5 is a schematic diagram of parts of the PUF generator 100 in an extraction operation corresponding to FIGS. 1-2, in accordance with some embodiments. FIG. 6 is a schematic diagram illustrating waveforms of signals in the PUF generator 100 corresponding to FIG. 5, in accordance with some embodiments.

In some embodiments of the extraction operation (referred to as a read operation), one bit cell BC is selected in response to the challenge input, and the bit data stored in the selected bit cell BC is read out to generate, by the sense amplifier 141, the output signal OUT. In the following paragraphs, the bit cell BC coupled to the word line WL1, the first data line BL1, and the second data line BL2 is given for illustrative purposes. The configurations of the bit cells BC in the PUF cell array 110 are similar to the given bit cell BC. Hence, the repetitious descriptions are omitted here.

More specifically, as shown in FIG. 6, the word line WL1 coupled to the selected BC is activated by applying the voltage VDD on the word line WL1 at a time T0 to initiate the read operation. A read voltage $V_{READ}$ is applied on the source line SL. Accordingly, the transistor Tr in FIG. 5 is turned on to pass a read current $I_R$ to flow to the memory cells 310-320. In some embodiments, the voltages VDD and $V_{READ}$ are different from each other. In various embodiments, the voltage $V_{READ}$ is smaller than the voltage VDD. Furthermore, the first data line BL11 and the second data line BL2 are discharged to about 0 volts before the time T0, and are charged by the current $I_L$ flowing through the memory cell 310 and the current $I_R$ following through the memory cell 320 respectively.

In some embodiments, magnitude of the currents $I_L$ and $I_R$ in the read operation are substantially different from each other. For illustration, with reference to FIGS. 4A and 5-6 together, as the memory cell 310 has the low resistance state (e.g., the parallel state) and the memory cell 320 has the high resistance state (e.g., the anti-parallel state), the current $I_L$ is greater than the current $I_R$. Accordingly, the first data line BL11 is charged faster by the current $I_L$, compared to the second data line BL2 charged by the current $I_R$, and the first data line BL1 is configured to have a voltage V1 that is greater than a voltage level, a voltage V2, of the second data line BL2 at time T1 in FIG. 6. The sense amplifier 141 compares the voltage levels of the first data line BL11 and the second data line BL2 to generate the output signal OUT. Alternatively stated, the sense amplifier 141 compares the voltages at two terminals of the selected bit cell BC to determine the data state of the bit data stored in the selected bit cell BC. In some embodiments, when the voltage level of the first data line BL11 is greater than that of the second data line BL21, as the embodiments shown in FIG. 4A, the output signal indicates that the data state is the logic "1."

On the contrary, in the embodiments shown in FIG. 4B, as the memory cell 310 has the high resistance state and the memory cell 320 has the low resistance state, the current $I_L$ is smaller than the current $I_R$. Accordingly, the first data line BL11 is charged slower by the current $I_L$, compared to the second data line BL2 charged by the current $I_R$, and the voltage level of the first data line BL11 is smaller than that of the second data line BL21. Correspondingly, the output signal indicates that the data state is the logic "0."

In some approaches, a PUF cell array includes bit cells having three or more than three transistors to store bit data. Accordingly, the PUF cell array suffers from the area penalty. With the configurations of the present disclosure, the demanded area for bit cells is significantly reduced by utilizing the bit cells BC having one transistor and two MTJ memory cells, compared with some approaches.

In other approaches, by utilizing challenge pulses to alter state of a MTJ cell in a bit cell and determining the switching rate thereof, the inter-hamming distance of a PUF cell array is relative low, at about 45.83%, compared with ideal 50%, while in such approaches considerable power, about 3.9 pJ, is consumed for reading a bit in about 90 ns. To compare with the approaches, in some embodiments of the present disclosure, only energy of about 13 fJ is needed for accessing one bit cell and it causes about 10 ns. Alternatively stated, with the configurations of the present disclosure, power consumption, operation speed, and area utilization are improved.

The configurations of FIGS. 3-5 are given for illustrative purposes. Various implements are within the contemplated scope of the present disclosure. For example, in some embodiments, the capacitors C1-C2 are omitted.

Figure 7:
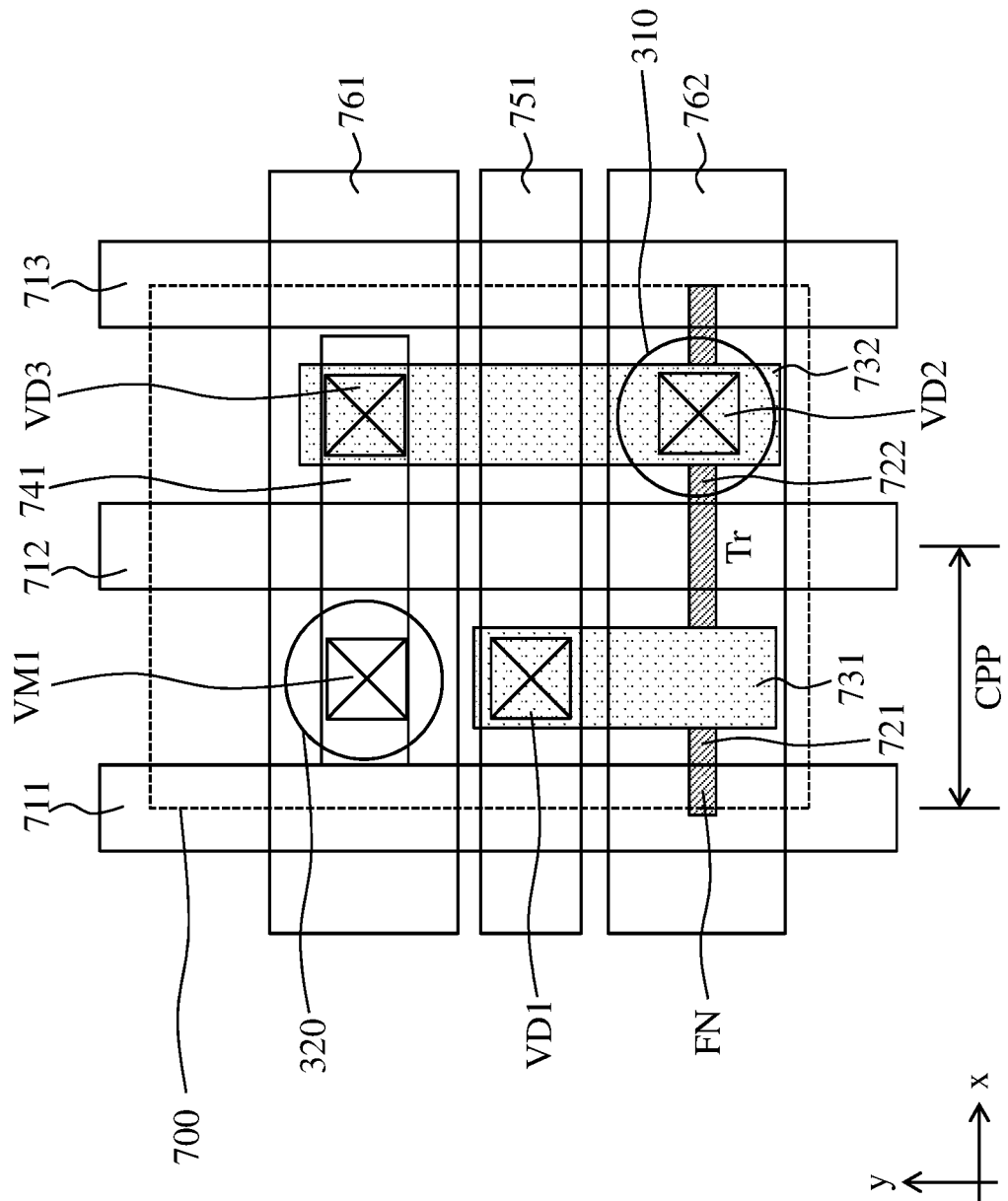
FIG. 7 is a layout diagram in a plane view of parts of the PUF generator corresponding to FIGS. 1-5, in accordance with some embodiments.

Reference is now made to FIG. 7. FIG. 7 is a layout diagram in a plane view of parts of the PUF generator 100 corresponding to FIGS. 1-5, in accordance with some embodiments. For illustration, a bit cell 700 includes gates 711-713, a fin structure FN including active regions 721-722, conductive segments (e.g., metal-on-device MD, or metal zero M0 layer) 731-732, a conductive line (e.g., metal one M1 layer) 741, a conductive trace (e.g., metal two M2 layer) 751, metal lines (e.g., metal layers referred to as metal four M4 to metal seven M7) 761-762, vias VD1-VD3 and VM1, and MTJ structures corresponding to the memory cells 310-320. In some embodiments, the bit cell 700 is configured with respect to, for example, the bit cell BC in FIG. 2. In some embodiments, the fin structure FN is in a first layer. The gates 711-713 are in a second layer above the first layer. The conductive segments 731-732 are in a third layer above the second layer. The conductive line 741 and the conductive trace 751 are, respectively, in a fourth layer and fifth layer that are above the third layer. The metal lines 761-762 are in a sixth layer above the fifth layer.

In some embodiments, the conductive segment 731 corresponds to a source terminal, coupled to the source line SL, of the transistor Tr, and the conductive segment 732 corresponds to a drain terminal, coupled to the memory cells 310-320, of the transistor Tr. The gate 712 corresponds to the control terminal of the transistor Tr. The gates 711 and 713 are referred to as dummy gates, in which in some embodiments, the "dummy" gates are referred to as being not electrically connected as the gates for MOS devices, having no function in the circuit. The conductive trace 751 corresponds to the source line SL.

For illustration, the fin structure FN extends in x direction. The gates 711-713 and the conductive segments 731-732 extend in y direction and are separated from each other in x direction. The conductive line 741, the conductive trace 751, and the metal lines 761-762 extend in x direction and are separated from each other in y direction. The memory cell 310 is disposed between the gates 711-712, and the memory cell 320 is disposed between the gates 712-713.

The conductive segment 731 is coupled to the conductive trace 751 through the via VD1 and coupled to the active region 721. Accordingly, the source terminal of the transistor Tr is coupled to the source line SL. The conductive segment 732 is coupled to the active region 722 and coupled to the memory cell 310 through the via VD2. Accordingly, the drain terminal of the transistor Tr is coupled to the memory cell 310 that further is coupled to the metal line 761 corresponding to one of the first data line, for example, BL11. The conductive segment 732 is further coupled to the conductive line 741 by the via VD3. The conductive line 741 is coupled to, by the via VM1, the metal line 761 corresponding to one of the second data line, for example, BL21.

In some embodiments, the gates 711-713 are separated from each other by a poly pitch of, for example, around 54 nanometers. A diameter of the MTJ memory cells 310-320 is, for example, around 30 nanometers, and the memory cells 310-320 are separated from each other by a pitch of, for example, about 90 nanometers. The parameters for components mentioned above are given for illustrative purposes, and the present disclosure is not limited thereto.

The configurations of FIG. 7 are given for illustrative purposes. Various implements are within the contemplated scope of the present disclosure. For example, in some embodiments, both of the memory cells 310-320 are arranged between the gates 712-713.

Figure 8:
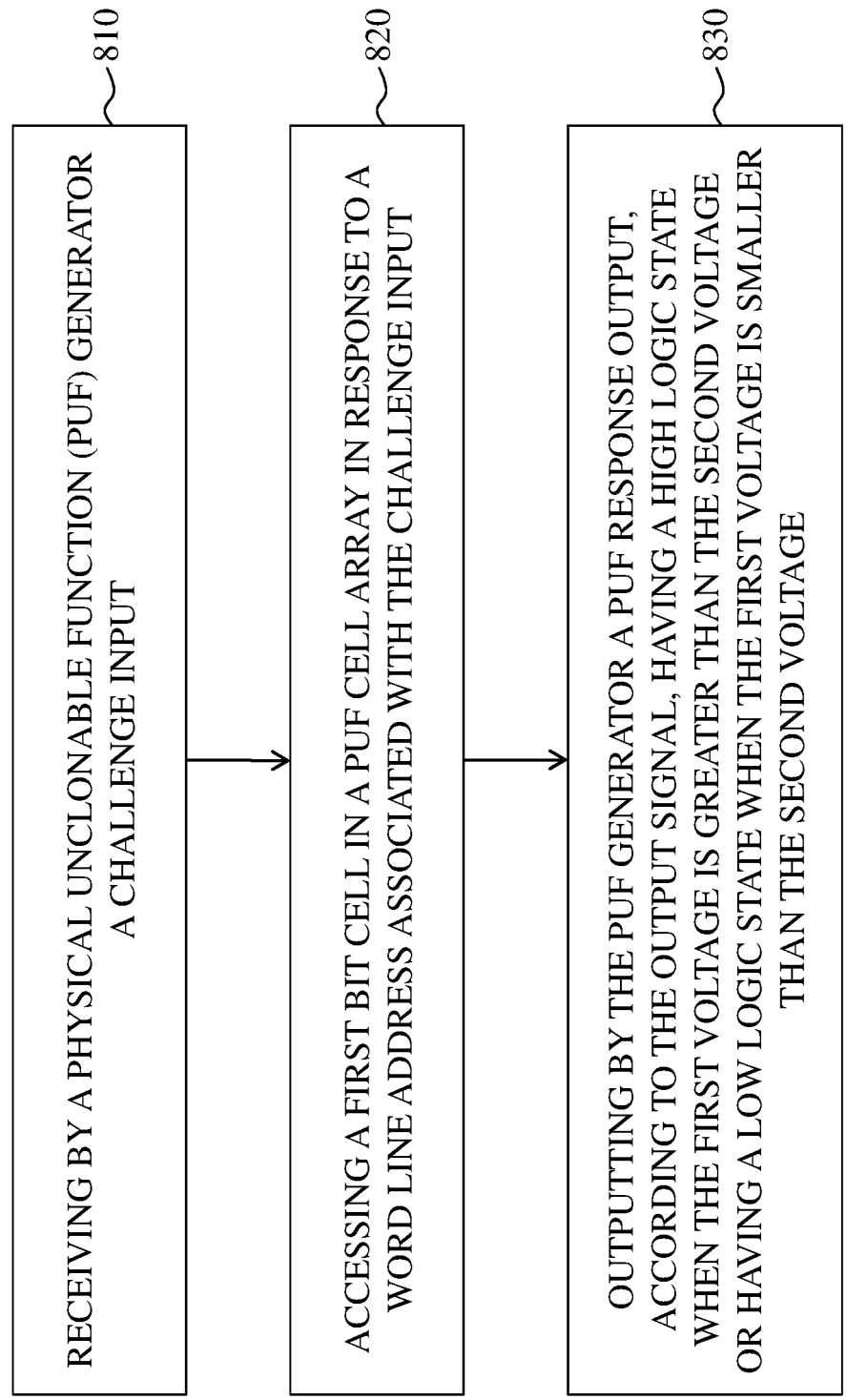
FIG. 8 is a flow chart of operating the PUF generator corresponding to FIGS. 1-7, in accordance with some embodiments.

Reference is now made to FIG. 8. FIG. 8 is a flow chart of operating the PUF generator 100 corresponding to FIGS. 1-7, in accordance with some embodiments. It is understood that additional operations can be provided before, during, and after the processes shown by FIG. 8, and some of the operations described below can be replaced or eliminated, for additional embodiments of the method. The order of the operations/processes may be interchangeable. Throughout the various views and illustrative embodiments, like reference numbers are used to designate like elements. The method 800 includes operations 810-830 that are described below with reference to the PUF generator 100 in FIGS. 1-7.

In operation 810, in FIG. 1, the physical unclonable function (PUF) generator 100 receives the challenge input 101.

In operation 820, as shown in FIG. 2, the bit cell BC in the PUF cell array 110 is accessed for the read operation or the write operation in response to a word line address associated with the challenge input 101.

In some embodiments, accessing the bit cell BC further includes operations of in the read operation comparing by the sense amplifier 141 the voltage, for example, the voltage at the terminal, coupled to the first data line BL11, of the memory cell 310 in FIG. 4A with the voltage, for example, the voltage at the terminal, coupled to the second data line BL22, of the memory cell 320 to generate the output signal OUT shown in FIG. 5. The other terminals of the memory cells 310-320 are coupled together to receive the read voltage $V_{READ}$ applied on the source line SL.

In some embodiments, accessing the bit cell BC further includes operations of in the read operation, transmitting the read voltage from the source line SL to the other terminals of the memory cells 310-320 by the transistor Tr coupled between the source line SL and the other terminals of the memory cell 310-320.

In some embodiments, accessing the bit cell BC further includes operations of in the read operation, charging the first data line, for example, BL11 coupled to the terminal of the memory cell 310 to have the voltage level of the voltage V1 from a voltage level of, for example, 0 Volts, by a signal, for example, the current $I_L$ from the memory cell 310. Accessing the bit cell BC further includes operations of in the read operation charging the second data line, for example, BL21 coupled to the terminal of the memory cell 320 to have the voltage level of the voltage V2 from a voltage level of, for example, 0 Volts, by a signal, for example, the current $I_R$ from the memory cell 320.

In some embodiments, accessing the bit cell BC further includes operations of in the read operation turning the transistor Tr by applying the word line voltage, for example, the voltage VDD, at the control terminal of the transistor Tr. Accessing the bit cell BC further includes operations of in the read operation applying the read voltage $V_{READ}$ on the source line SL. In some embodiments, the read voltage $V_{READ}$ is smaller than the voltage (e.g., the voltage VDD) applied on the word line and is greater than 0 Volts.

In some embodiments, in the read operation, the memory cell 310 has the resistance state, and the memory cell 320 has the other resistance state different from that of the memory cell 310, as shown in FIGS. 4A-4B.

In some embodiments, accessing the bit cell BC further includes operations of in the write operation applying a voltage, for example, the voltage VDD at the terminals, coupled to the first data line BL11 and the second data line BL22, of the memory cells 310 and 320 and applying the voltage, for example, a grounded voltage smaller than the voltage VDD, on the source line SL. In some embodiments, the voltage VDD is different from the voltages V1 and V2.

In some embodiments, as discussed in the write operation above, specifically, the resistance state of one of the memory cells 310-320, for example, the memory cell 310 of FIG. 4A, is altered to the parallel resistance state, from the anti-parallel resistance state, of the magnetic tunneling junction. The resistance state of the other one of the memory cells 310-320, for example, the memory cell 310 is still the anti-parallel state.

Figure 9:
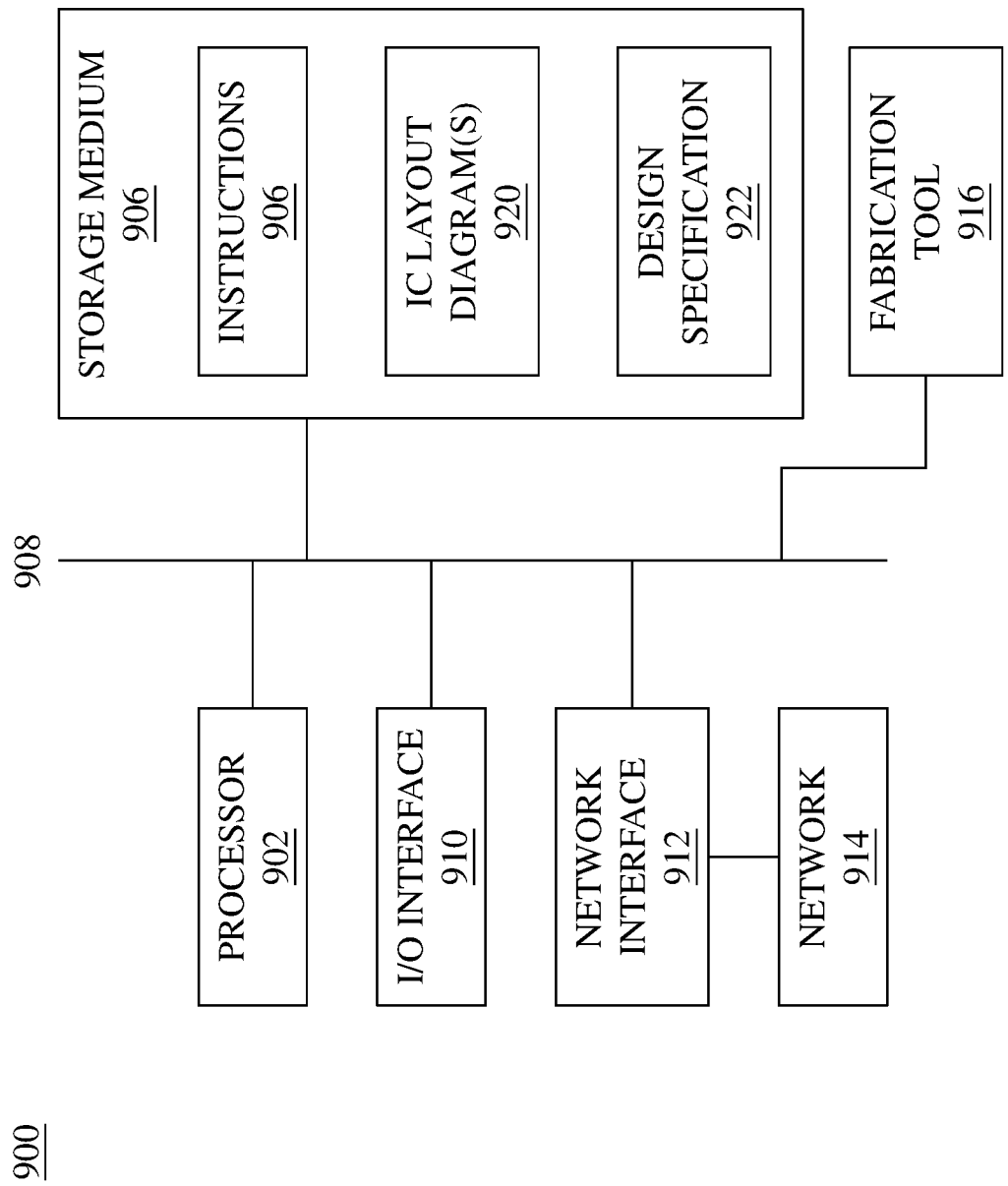
FIG. 9 is a block diagram of a system for designing the integrated circuit layout design, in accordance with some embodiments of the present disclosure.

Reference is now made to FIG. 9. FIG. 9 is a block diagram of an electronic design automation (EDA) system 900 for designing the integrated circuit layout design, in accordance with some embodiments of the present disclosure. EDA system 900 is configured to implement one or more operations of the method 800 disclosed in FIG. 8, and further explained in conjunction with FIGS. 1-7. In some embodiments, EDA system 900 includes an APR system.

In some embodiments, EDA system 900 is a general purpose computing device including a hardware processor 902 and a non-transitory, computer-readable storage medium 904. Storage medium 904, amongst other things, is encoded with, i.e., stores, computer program code (instructions) 906, i.e., a set of executable instructions. Execution of instructions 906 by hardware processor 902 represents (at least in part) an EDA tool which implements a portion or all of, e.g., the method 800.

The processor 902 is electrically coupled to computer-readable storage medium 904 via a bus 908. The processor 902 is also electrically coupled to an I/O interface 910 and a fabrication tool 916 by bus 908. A network interface 912 is also electrically connected to processor 902 via bus 908. Network interface 912 is connected to a network 914, so that processor 902 and computer-readable storage medium 904 are capable of connecting to external elements via network 914. The processor 902 is configured to execute computer program code 906 encoded in computer-readable storage medium 904 in order to cause EDA system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause EDA system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores IC layout diagram 920 of standard cells including such standard cells as disclosed herein, for example, a cell including in the bit cell 700 discussed above with respect to FIG. 7.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows EDA system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-964. In one or more embodiments, a portion or all of noted processes and/or methods, is implemented in two or more systems 900.

EDA system 900 also includes the fabrication tool 916 coupled to processor 902. The fabrication tool 916 is configured to fabricate integrated circuits, e.g., the PUF generator 100 illustrated in FIGS. 1-7, according to the design files processed by the processor 902.

EDA system 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as design specification 922.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 10:
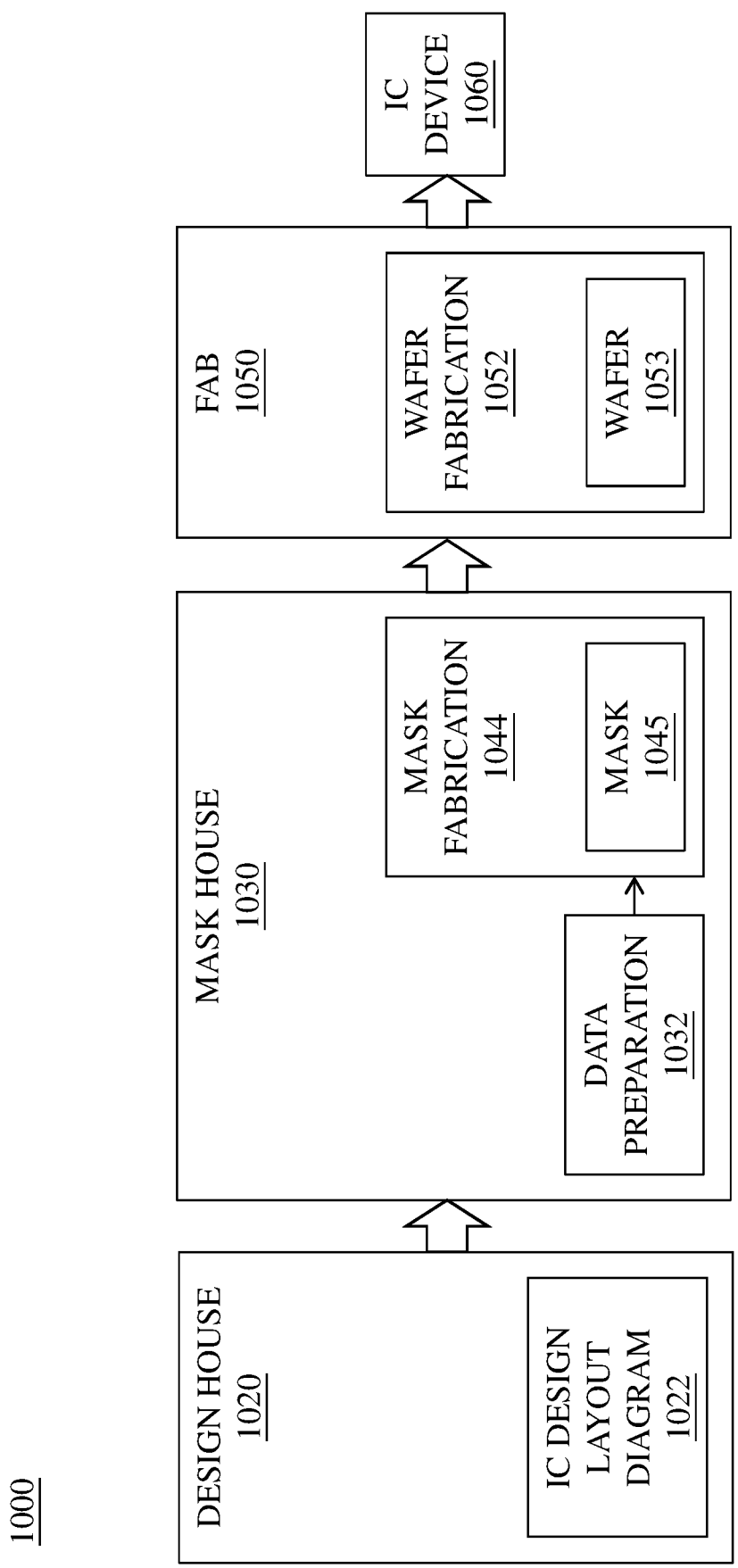
FIG. 10 is a block diagram of an integrated circuit manufacturing system, and an integrated circuit manufacturing flow associated therewith, in accordance with some embodiments.

FIG. 10 is a block diagram of IC manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in IC manufacturing system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns, for example, an IC layout design depicted in FIG. 7, designed for parts of the PUF generator 100, for example, the bit cell 700 in FIG. 7. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The IC design layout diagram 1022 is manipulated by mask data preparation 1032 to comply with particular characteristics of the mask writer and/or requirements of IC fab 1050. In FIG. 10, data preparation 1032 and mask fabrication 1044 are illustrated as separate elements. In some embodiments, data preparation 1032 and mask fabrication 1044 can be collectively referred to as mask data preparation.

In some embodiments, data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1045 includes a transparent substrate (for example, fused quartz) and an opaque material (for example, chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM.

The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 includes wafer fabrication 1052. IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multi-level interconnects, and the like (formed at subsequent manufacturing steps).

As described above, the present disclosure provides a device including a PUF generator. The PUF generator includes bit cells having one transistor and two MTJ memory cells. In an enrollment operation, two MTJ in the cell have different states randomly, which provides uniqueness and randomness of the PUF generator. Moreover, with fewer components in the bit cells and reduced read current in shorter accessing time of the bit cells, improved area utilization, power consumption, and operation speed are provided.

In some embodiments, a device is provided. The device includes a physical unclonable function (PUF) cell array. The PUF cell array includes multiple bit cells, and generates a PUF response output, in response to a challenge input, based on a data state of one bit cell in the bit cells. Each of the bit cells stores a bit data and includes a transistor having a control terminal coupled to a word line and a first terminal coupled to a source line, a first memory cell having a first terminal coupled to a first data line and a second terminal coupled to a second terminal of the transistor, and a second memory cell having a first terminal coupled to a second data line, different from the first data line, and a second terminal coupled to the second terminal of the first memory cell at the second terminal of the transistor.

In some embodiments, a resistance of the first memory cell is substantially different from that of the second memory cell.

In some embodiments, the device further includes a sense amplfier configured to compare a voltage level of the first data line with a voltage level of the second data line to generate an output signal, indicating a data state of a corresponding bit cell in the plurality of bit cells, as the PUF response output.

In some embodiments, when the voltage level of the first data line is greater than the voltage level of the second data line, the output signal has a high logic state. When the voltage level of the second data line is greater than the voltage level of the first data line, the output signal has a low logic state.

In some embodiments, in a read operation of a first bit cell in the plurality of bit cells, a word line voltage at the control terminal of the transistor in the first bit cell is different from a read voltage at the first terminal of the transistor in the first bit cell.

In some embodiments, in a read operation of the PUF cell array, a magnitude of a first read current flowing through the first memory cell is substantially different from that of a second read current flowing through the second memory cell.

In some embodiments, the word line coupled to a selected bit cell of the plurality of bit cells is activated in response to a word line address associated with the challenge input.

In some embodiments, the first memory cell and the second memory cell have magnetic tunning junctions.

In some embodiments, a first bit cell in the plurality of bit cells is configured to store a first logic state when the first memory cell in the first bit cell has a first resistance state and the second memory cell in the first bit cell has a second resistance state different from the first resistance state. A second bit cell in the plurality of bit cells is configured to store a second logic state different from the first logic state when the first memory cell in the second bit cell has the second resistance state and the second memory cell in the second bit cell has the first resistance state.

In some embodiments, a method is provided and includes the following operations: receiving by a physical unclonable function (PUF) generator a challenge input; accessing a first bit cell in a PUF cell array in response to a word line address associated with the challenge input; and outputting by the PUF generator a PUF response output, according to the output signal, having a high logic state when the first voltage is greater than the second voltage or having a low logic state when the first voltage is smaller than the second voltage. The accessing the first bit cell includes in a read operation, comparing by a sense amplifier a first voltage at a first terminal of a first memory cell in the first bit cell with a second voltage at a first terminal of a second memory cell in the first bit cell to generate an output signal. Second terminals of the first and second memory cells are coupled together to receive a read voltage.

In some embodiments, accessing the first bit cell further includes operations of in the read operation, transmitting the read voltage from a source line to the second terminals of the first and second memory cells by a transistor coupled between the source line and the second terminals of the first and second memory cells.

In some embodiments, accessing the first bit cell further includes operations of in the read operation, charging a first data line, coupled to the first terminal of the first memory cell, to have a voltage level, equal to the first voltage, from a voltage level of a third voltage, different from the first and second voltage, by a first signal received from the first memory cell. Accessing the first bit cell further includes operations of charging a second data line, coupled to the first terminal of the second memory cell, to have a voltage level, equal to the second voltage, from a voltage level of the third voltage by a second signal received from the second memory cell.

In some embodiments, accessing the first bit cell further includes operations of in the read operation, turning on a transistor coupled between a source line and the second terminals of the first and second memory cells by applying a word line voltage at a control terminal of the transistor, and applying a read voltage on the source line, wherein the read voltage is smaller than the word line voltage and greater the third voltage.

In some embodiments, in the read operation, the first memory cell has a first resistance state, and the second memory cell has a second resistance state different from the first resistance state.

In some embodiments, a transistor is coupled between a source line and the second terminals of the first and second memory cells.

In some embodiments, accessing the first bit cell further includes operations of in a write operation, applying a third voltage, different from the first and second voltages, at the first terminals of the first and second memory cells, and applying a fourth voltage, smaller than the third voltage, on the source line.

In some embodiments, in the write operation, a resistance state of one of the first and second memory cells is altered to a parallel resistance state, from an anti-parallel resistance state, of a magnetic tunneling junction, and a resistance state of the other one of the first and second memory cells is the anti-parallel resistance state.

In some embodiments, a device is provided. The device includes a sense amplifier and a first bit cell in a physical unclonable function (PUF) cell array. The first bit cell stores a first bit data associated with a first challenge input. The first bit cell has a first terminal coupled to a first terminal of the sense amplifier, a second terminal coupled to a second terminal, different from the first terminal, of the sense amplifier, and a third terminal coupled to a source line. When a read operation is performed to the first bit cell in response to a word line coupled to the first bit cell being activated, the sense amplifier compares a first voltage at the first terminal of the first bit cell with a second voltage at the second terminal of the first bit cell to generate an output signal, that indicates a first data state of the first bit data, as a PUF response output.

In some embodiments, the first bit cell includes a transistor having a control terminal coupled to the word line and a first terminal coupled to the third terminal of the first bit cell, a first magnetic tunneling junction memory cell having a free layer coupled to the first terminal of the first bit cell and a pinned layer coupled to a second terminal of the transistor, and a second magnetic tunneling junction memory cell having a free layer coupled to the second terminal of the first bit cell and a pinned layer coupled to the second terminal of the transistor.

In some embodiments, the first and second magnetic tunneling junction memory cells have different resistance states.

In some embodiments, the device includes a second bit cell storing a second bit data, different from the first bit data, associated with a second challenge input different from the first challenge input. Each of the first and second bit cells has a first memory cell coupled to the first terminal of the sense amplifier and a second memory cell coupled to the second terminal of the sense amplifier. The first memory cells in the first and second bit cells have different resistance states, and the second memory cells in the first and second bit cells have different resistance states.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a physical unclonable function (PUF) cell array comprising a plurality of bit cells, and configured to generate a PUF response output, in response to a challenge input, based on a data state of one bit cell in the plurality of bit cells,
wherein each of the plurality of bit cells is configured to store a bit data and comprises:
a transistor having a control terminal coupled to a word line and a first terminal coupled to a source line;
a first memory cell having a first terminal coupled to a first data line and a second terminal coupled to a second terminal of the transistor; and
a second memory cell having a first terminal coupled to a second data line, different from the first data line, and a second terminal coupled to the second terminal of the first memory cell at the second terminal of the transistor.

2. The device of claim 1, wherein a resistance of the first memory cell is substantially different from that of the second memory cell.

3. The device of claim 1, further comprising:
a sense amplifier configured to compare a voltage level of the first data line with a voltage level of the second data line to generate an output signal, indicating a data state of a corresponding bit cell in the plurality of bit cells, as the PUF response output.

4. The device of claim 3, wherein when the voltage level of the first data line is greater than the voltage level of the second data line, the output signal has a high logic state,
wherein when the voltage level of the second data line is greater than the voltage level of the first data line, the output signal has a low logic state.

5. The device of claim 1, wherein in a read operation of a first bit cell in the plurality of bit cells, a word line voltage at the control terminal of the transistor in the first bit cell is different from a read voltage at the first terminal of the transistor in the first bit cell.

6. The device of claim 1, wherein in a read operation of the PUF cell array, a magnitude of a first read current flowing through the first memory cell is substantially different from that of a second read current flowing through the second memory cell.

7. The device of claim 1, wherein the word line coupled to a selected bit cell of the plurality of bit cells is activated in response to a word line address associated with the challenge input.

8. The device of claim 1, wherein the first memory cell and the second memory cell have magnetic tunneling junctions.

9. The device of claim 8, wherein a first bit cell in the plurality of bit cells is configured to store a first logic state when the first memory cell in the first bit cell has a first resistance state and the second memory cell in the first bit cell has a second resistance state different from the first resistance state, and
a second bit cell in the plurality of bit cells is configured to store a second logic state different from the first logic state when the first memory cell in the second bit cell has the second resistance state and the second memory cell in the second bit cell has the first resistance state.

10. A method, comprising:
receiving by a physical unclonable function (PUF) generator a challenge input;
accessing a first bit cell in a PUF cell array in response to a word line address associated with the challenge input, wherein accessing the first bit cell comprises:
in a read operation, comparing by a sense amplifier a first voltage at a first terminal of a first memory cell in the first bit cell with a second voltage at a first terminal of a second memory cell in the first bit cell to generate an output signal,
wherein second terminals of the first and second memory cells are coupled together to receive a read voltage; and
outputting by the PUF generator a PUF response output, according to the output signal, having a high logic state when the first voltage is greater than the second voltage or having a low logic state when the first voltage is smaller than the second voltage.

11. The method of claim 10, wherein accessing the first bit cell further comprises:
in the read operation, transmitting the read voltage from a source line to the second terminals of the first and second memory cells by a transistor coupled between the source line and the second terminals of the first and second memory cells.

12. The method of claim 10, wherein accessing the first bit cell further comprises:
in the read operation, charging a first data line, coupled to the first terminal of the first memory cell, to have a voltage level, equal to the first voltage, from a voltage level of a third voltage, different from the first and second voltage, by a first signal received from the first memory cell, and
charging a second data line, coupled to the first terminal of the second memory cell, to have a voltage level, equal to the second voltage, from a voltage level of the third voltage by a second signal received from the second memory cell.

13. The method of claim 12, wherein accessing the first bit cell further comprises:
in the read operation, turning on a transistor coupled between a source line and the second terminals of the first and second memory cells by applying a word line voltage at a control terminal of the transistor, and
applying a read voltage on the source line, wherein the read voltage is smaller than the word line voltage and greater the third voltage.

14. The method of claim 10, wherein in the read operation, the first memory cell has a first resistance state, and the second memory cell has a second resistance state different from the first resistance state.

15. The method of claim 10, wherein a transistor is coupled between a source line and the second terminals of the first and second memory cells;
wherein accessing the first bit cell further comprises:
in a write operation, applying a third voltage, different from the first and second voltages, at the first terminals of the first and second memory cells, and applying a fourth voltage, smaller than the third voltage, on the source line.

16. The method of claim 15, wherein in the write operation, a resistance state of one of the first and second memory cells is altered to a parallel resistance state, from an anti-parallel resistance state, of a magnetic tunneling junction, and a resistance state of the other one of the first and second memory cells is the anti-parallel resistance state.

17. A device, comprising:

a sense amplifier; and a first bit cell, in a physical unclonable function (PUF) cell array, configured to store a first bit data associated with a first challenge input, wherein the first bit cell has a first terminal coupled to a first terminal of the sense amplifier, a second terminal coupled to a second terminal, different from the first terminal, of the sense amplifier, and a third terminal coupled to a source line;

wherein when a read operation is performed to the first bit cell in response to a word line coupled to the first bit cell being activated, the sense amplifier is configured to compare a first voltage at the first terminal of the first bit cell with a second voltage at the second terminal of the first bit cell to generate an output signal, that indicates a first data state of the first bit data, as a PUF response output.

18. The device of claim 17, wherein the first bit cell comprises:

a transistor having a control terminal coupled to the word line and a first terminal coupled to the third terminal of the first bit cell;

a first magnetic tunneling junction memory cell having a free layer coupled to the first terminal of the first bit cell and a pinned layer coupled to a second terminal of the transistor; and a second magnetic tunneling junction memory cell having a free layer coupled to the second terminal of the first bit cell and a pinned layer coupled to the second terminal of the transistor.

19. The device of claim 18, wherein the first and second magnetic tunneling junction memory cells have different resistance states.

20. The device of claim 17, further comprising:

a second bit cell configured to store a second bit data, different from the first bit data, associated with a second challenge input different from the first challenge input, wherein each of the first and second bit cells has a first memory cell coupled to the first terminal of the sense amplifier and a second memory cell coupled to the second terminal of the sense amplifier, wherein the first memory cells in the first and second bit cells have different resistance states, and the second memory cells in the first and second bit cells have different resistance states.

* * * * *